United States Patent
Ma

(10) Patent No.: US 9,438,104 B2
(45) Date of Patent: Sep. 6, 2016

(54) FAST STARTUP CHARGE PUMP

(71) Applicant: SMARTER MICROELECTRONICS (GUANG ZHOU) CO., LTD, Guangzhou (CN)

(72) Inventor: Jun Ma, Guangzhou (CN)

(73) Assignee: SMARTER MICROELECTRONICS (GUANG ZHOU) CO., LTD, Guangzhou (CN)

( * ) Notice: Subject to any disclaimer, the term of this patent is extended or adjusted under 35 U.S.C. 154(b) by 0 days.

(21) Appl. No.: 14/732,581

(22) Filed: Jun. 5, 2015

(65) Prior Publication Data

US 2015/0270775 A1    Sep. 24, 2015

Related U.S. Application Data

(63) Continuation of application No. PCT/CN2013/075713, filed on May 16, 2013.

(30) Foreign Application Priority Data

Dec. 7, 2012   (CN) .......................... 2012 1 0524380

(51) Int. Cl.
| | |
|---|---|
| G05F 1/10 | (2006.01) |
| G05F 3/02 | (2006.01) |
| H02M 3/07 | (2006.01) |
| H02M 1/36 | (2007.01) |
| H03F 3/195 | (2006.01) |
| H03F 3/213 | (2006.01) |

(52) U.S. Cl.
CPC ................. *H02M 3/07* (2013.01); *H02M 1/36* (2013.01); *H03F 3/195* (2013.01); *H03F 3/213* (2013.01); *H03F 2200/27* (2013.01)

(58) Field of Classification Search
CPC ....... H02M 3/073; H02M 3/07; G11C 5/145; G11C 16/30; G05F 3/205
USPC ......................................... 327/157, 534–536
See application file for complete search history.

(56) References Cited

U.S. PATENT DOCUMENTS

| | | | |
|---|---|---|---|
| 5,036,229 A | 7/1991 | Tran | |
| 6,636,105 B2 | 10/2003 | Soda | |
| 6,794,927 B2 | 9/2004 | Bedarida et al. | |
| 7,005,896 B2 | 2/2006 | Chen et al. | |
| 7,579,902 B2 * | 8/2009 | Frulio | G11C 5/145 327/536 |
| 2005/0242869 A1 | 11/2005 | Kahlman | |
| 2013/0029614 A1 * | 1/2013 | Cho | H04B 1/48 455/83 |

* cited by examiner

*Primary Examiner* — Lincoln Donovan
*Assistant Examiner* — Diana J Cheng
(74) *Attorney, Agent, or Firm* — Syncoda LLC; Feng Ma; Junjie Feng

(57) ABSTRACT

A charge pump is designed to be capable of quick start up. When the enable signal of the charge pump is arrived, the pump capacitor and the load capacitor of the charge pump can be charged in a short time, referred to as a pre-charging stage. During the normal working period, the pump capacitor and the output capacitor are controlled by the proper switch that is configured into the connection relationship that the charge pump can normally work in order to make the charge pump work normally. As a result of the pre-charge operation, embodiments disclosed herein can reduce the time of the output capacitor for reaching a steady state value.

17 Claims, 5 Drawing Sheets

FAST STARTUP CHARGE PUMP

CROSS-REFERENCE TO RELATED APPLICATIONS

The present application is a continuation of, and claims priority to, PCT/CN/2013/075713 filed on May 16, 2013, which claims priority to Chinese Patent Application CN 201210524380.X filed on Dec. 7, 2012. The disclosures of the above applications are hereby incorporated by reference in their entirety.

BACKGROUND

With the decrease of the semiconductor integrated circuit in size, the supply voltage becomes lower and lower, and charge pumps, such as power management integrated circuits, non-volatile memories, switched capacitor circuits, operational amplifiers, transformers, SRAM, LCD drivers, RF antenna switch controllers, are becoming more widely used. An example of the use of the electric circuits of charge pumps is to provide a negative voltage source, which voltage is lower than that of the ground, to control the operation of the RF antenna switches.

SUMMARY

A charge pump circuit can be positive voltage charge pump or negative voltage charge pump. Charge pump could but not must appear as repeating units, and the repeating units are connected to one another through cascade connection. Every stage comprises a pump switch and a pump capacitor, the connection point of the pump switch and the pump capacitor at every stage is the output point of this stage, and the other end of the pump switch is the input point of the voltage charge pump of this stage, and the connecting end which is not the pump switch end of the pump capacitor is called the control end. When the charge pumps are connected by cascade configuration the output points of the present stage are all connected to the input points of the next stage, and the input points are all connected to the output points of the previous stage; while the control ends of pump capacitors of adjacent stages of charge pumps are alternately connected to one of two inverted or non-overlapping clock control lines, the clock control line controls the switch operation, and the switch controls so-called charge pumping along these stages.

Taking a negative voltage charge pump as an example, the working process of the charge pump is as follows, in the first half of a clock cycle, the pump switch of this level is switched on (low impedance), at the same time, the pump of the next stage is switched off (high impedance), and pump capacitor control end is set by the clock control line to a high electrical level, and the clock control end of the pump capacitor of previous stage is at low electrical level, thus there will be displacement current formed by positive charge flowing from pump capacitor of this level to the pump capacitor of previous stage, this completes a charge storage at this stage of capacitor; In the second half of the clock cycle, the pump switch of this stage is switched off, the control end of the pump capacitor of this stage is set to low electrical level, the output voltage of the pump capacitor of this level will be lower, at the same time, the pump switch of next stage is switched on, the clock end of the pump capacitor of next stage is set to high electrical level, the electrical level of the output end of the pump capacitor of next stage will be higher, thus there will be displacement current formed by positive charge flowing from the pump capacitor of the next stage to the pump capacitor of this stage This completes a cycle of the charge pumping. If a multiple-levels of charge pumps are connected in series, the charge will be pumped to the pump capacitor of previous stage in turn, the final charge pump output, will reach the lowest electrical level. More levels produce lower output voltages.

Taking a negative voltage circuit containing one stage of charge pump as an example, as shown in FIG. 1, the pump capacitor C5, the pump switch S16_ck1 and the pump switch S18_ck2 are connected to the node N10; the pump capacitor C5, the pump switch S17_ck2 and the pump switch S15_ck1 are connected to the node N9; the positive electrode of power source VDC3 and the pump switch S18_ck2 are connected to the node NVDD3; the pump capacitor C6 and the pump switch S15_ck1 are connected to the node N11, the N11 is the output node of the external load; the negative electrode of the power source VDC3, the pump switch S16_ck1, the pump switch S17_ck2 and the load capacitance C6 are connected to the node NGND3. When the circuit works, the pump switch S15_ck1 and the pump switch S16_ck1 are controlled by the same clock ck1; the pump switch S17_ck2 and the pump switch S18_ck2 are controlled by the clock ck2 which is an inverse of clock CK1. The inverted clock signal mentioned here is not necessarily a complete inverse. In practice, in order to prevent leakage during switching, the clock signal should be non-overlapping. In order to have the voltage of capacitor C6 charged to the desired voltage faster, the clock frequency or the size of the capacitor C5 may be increased.

In fact, the charge pump output requires multiple cycles to reach the required voltage, before reaching the steady state voltage, the voltage increment of the output voltage corresponding to the adjacent clock will gradually become smaller. In fact, the output voltage will increase quickly at the moment after starting the circuit, then relatively slowly climb to the steady state value, because with the gradual increase of the output voltage, electrical charges pumped within each clock cycle will reduce gradually. If the output voltage is required to rise to a steady value faster, unless special measures are taken, the clock frequency must be increased or the pump capacitor relative output capacitance should be a greater value. If the clock frequency is increased, it may introduce higher noise; in order to ensure smaller output voltage ripple, generally the larger value of output capacitance is chosen. If the pump capacitance is set to a value larger than the output capacitance, the area occupied by capacitor will be increased.

In sum, the existing technology is based on increasing clock frequency or increasing the capacitance of the pump capacitor to speed up the starting process of charge pump, but it will introduce larger switch noise or increase the chip area.

Embodiments disclosed herein provide a fast startup charge pump. Under the condition of making sure lower clock frequency and smaller size of capacitor, some embodiments can quickly make an output voltage of the charge pump to be a steady-state Voltage: in a first stage charge pump, the required time of making the output voltage into the steady-state voltage can be less than the time of one charging pulse in theory.

The solution adopted by various embodiments disclosed herein may include: once the enable signal of the charge pump arrived, the pump capacitor and (or) the load capacitor of the charge pump can be charged in a short time, it is a pre-charging stage; during the normal working period after pre-charging stage, disconnecting the charging path which is used for pre-charging the load capacitor in the pre-charging stage, and the state of each switch is configured to the required state which can allow conventional charge pump work normally in order to ensure that the charge pump works normally.

FIG. 2 shows a circuit diagram of the fast startup charge pump according to some embodiments, this circuit comprises at least two parts, the charge pump 1 and the output stage 2. The charge pump 1 can be a positive voltage charge pump or a negative voltage charge pump.

The charge pump 1 can comprise repeating units. The said repeating units are configured to be connected to one another with a cascade configuration. The charge pump 1 comprises a pump switch (Schg_n) and a pump capacitor (Cp_n), which are connected in series through a node (Nc_n); when the charge pumps are configured to be connected to one another in series, a connecting end (Ns_n) of a pump switch (Schg_n) of a current charge pump stage is configured to be connected to a node (Nc_n−1) of the previous charge pump stage while this connecting end (Ns_n) is not connected to the capacitor (Cp_n); a terminal (Nc_n) of a pump switch (Schg_n) of a current charge pump stage is configured to be connected to a node (Ns_n−1) of the next charge pump stage while this terminal (Nc_n) is connected to the capacitor (Cp_n); in the negative charge pump, the first stage of charge pump Ns_n end connects to the low voltage dc voltage source.

The load of charge pump 1 is the said output stage 2, the output stage includes an output switch (Sout), a switch (Spre) for pre-charging, a switch Spreb, a load capacitor (CL) and a current supply (IL) of the analog output load; wherein the output switch (Sout), load capacitor (CL) and switch (Spre) are connected in series; wherein the output switch (Sout), load capacitor (CL) and switch (Spre) are connected in series; the non-capacitance CL connecting end of Spre connects to the low-voltage end of the DC voltage source; one end of the switch (Spre) is configured to be connected to a low voltage side of a DC voltage source while this end of the switch (Spre) is not connected to the load capacitor (CL), one end of the output switch (Sout) is configured to be connected to a node (Nc_n) of the last charge pump stage while this end of the output switch (Sout) is not connected to the load capacitor (CL), one end of the switch (Spreb) is connected to a common node between the switch (Spre) and the load capacitor (CL), while another end of the switch (Spreb) is connected to a high voltage end of the DC voltage source, one end of the current source IL of the analog output load is connected to a common node between the output switch (Sout) and the load capacitor (CL), while another end of the current source IL is connected to the low voltage end of the DC voltage source.

A short period of time after the charge pump started-up (which is known as a pre-charging stage), the switch (Spreb) and the switch (Spre) are configured to be: in a positive voltage charge pump, switching on the switch (Spre) so that the Spre has a low impedance, and switching off switch Spreb so that the Spreb has a high impedance; and in the negative voltage charge pump, switching off the Spre so that the Spre has a high impedance, switching on the Spreb so that the Spreb has a low impedance. And then, in the normal working stage of charge pump, the switch (Spre) has an different switching state which is opposite to the state of switch (Spre) which is in the pre-charge period, and the switch (Spreb) also has a different switching state which is opposite to the state of switch (Spreb) which is in the pre-charge period.

After the pre-charging stage, a connecting end of the pump capacitor of the charge pump 1 is controlled by a control line 3 while this connecting terminal is not connected to a pump switch of the current charge pump stage, the control signal inputted to the control line is defined as symbol "ø"; and when the charge pumps are configured to be connected to one another in a multi-stage charge pump configuration, in the two adjacent charge pump stages, supplying one charge pump stage with a control signal that has an opposite-phase or non-overlapping relation to a control signal of another charge pump stage.

In addition, in the pre-charging stage, the pump switch (Schg_n) and the output switch (Sout) can be configured to an on state. In the positive voltage charge pump, the switch (Spreb) could always been configured to an off state, or the switch (Spreb) can be removed from the circuit, correspondingly, the switch (Spre) is in an on state all the time, or the (Spre) is replaced with a conductive wire/lead.

The following is a description of the working process of the circuit: once the enable signal of the charge pump is arrived, the pump capacitor or (and) the load capacitor of the charge pump can be charged in a short time, which is known as a pre-charging stage. During the normal working period after pre-charging stage, disconnecting the charging path which is used for pre-charging the load capacitor in the pre-charging stage, switching the load capacitor into the required configuration through switch in order to ensure that the charge pump can work normally. During the normal working period after the pre-charging stage, taking the negative voltage charge pump for example, the working process of charge pump of this disclosure is as follows: at the first half of a clock cycle, switching on the pump switch of a current charge pump stage (so that the switch of the current charge pump stage has a low impedance), at the same time, switching off the pump switch of the next charge pump stage (so that the switch of the next charge pump stage has a low impedance), the control terminal of the pump capacitor is controlled by the clock control line, and the control terminal is set to a high voltage, the control terminal of the pump capacitor of the previous charge pump stage is set to a low voltage, thus the displacement current formed by positive charge can flow from the pump capacitor of the current charge pump stage to the pump capacitor of the previous charge pump stage, so the pump capacitor of the current charge pump stage completes one charging; at the second half of a clock cycle, switching off the pump switch of the current charge pump stage, the control terminal of the pump capacitor of the current charge pump is set to a low voltage, the output terminal potential of pump capacitor of the current charge pump stage is set to a low level voltage, at the same time, switching on the pump switch of the next charge pump stage, and the clock control terminal of the pump capacitor of the next charge pump stage is set to a high voltage, the output terminal potential of the pump capacitor of the next charge pump stage is set to a high level, so the displacement current formed by positive charge can flow from the pump capacitor of next charge pump stage to the pump capacitor of the current charge pump stage. The circuit completes a cycle of charge pumping operation. If many charge pumps are connected in series, the electric charge will be transferred to the pump capacitor of the previous charge pump stage in turn, and the output of the final charge pump stage will reach the lowest voltage level. More pump charge stages will make the output voltage level be lower.

Due to the pre-charging operation, in one clock operation period, the charge provided for the load capacitor and (or) the pump capacitor make the voltage value of this capacitors to reach that required by a DC voltage source at a time. And in the case where there is no pre-charging operation, in each clock operation, at most provided sufficient charge that makes the voltage value of the capacitors of the first charge pump stage to reach that required by a DC voltage source. By contrast, the pre-charging operation can largely reduce the time of the load capacitor achieves its steady state value, the fewer charge pump stages are used, the quicker the circuit starts up. Ideally, just one charge pump is used, only one clock operation is needed—the time required, according to the actual need, the time of pre-charging can be set to less than a clock cycle and make the output to reach the steady state voltage.

Embodiments disclosed herein may have the following beneficial results: under the condition of making sure relatively low clock frequency and relatively small size of capacitor, to make the output voltage of the charge pump to be steady-state voltage quickly—the time of the output voltage achieves a steady-state voltage can be less than the time of one charging pulse in theory.

FIG. 5 shows an embodiment of a fast startup charge pump according to some embodiments: the device 44 can be but not must be a RF power amplifier control device, the device 44 can have but not must have the RF antenna switch controller 42, an embodiment of this disclosure is contained in the circuit 41, the circuit 41 and the RF antenna switch controller 42 can be but not must be deposited on the common substrate 43.

DETAILED DESCRIPTION

Figure 1:
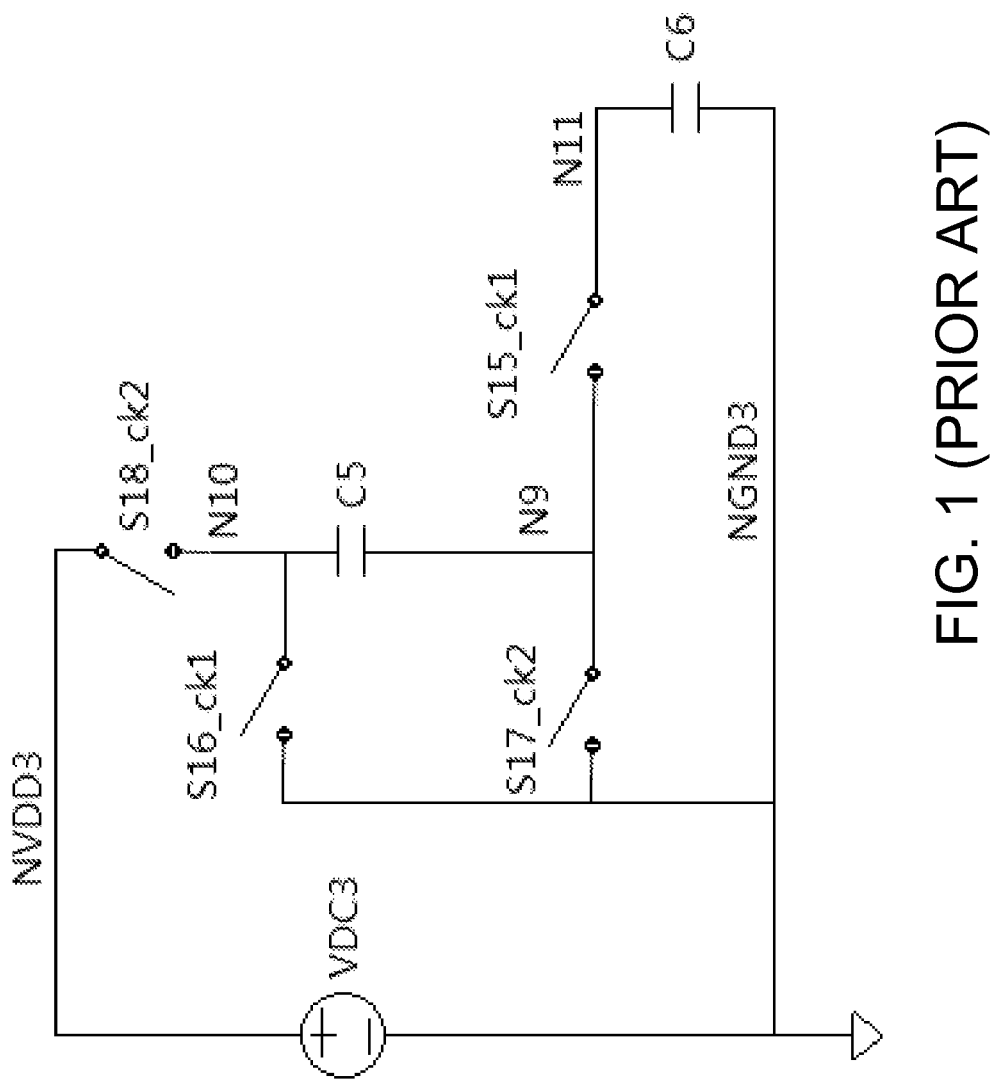
FIG. 1 is a schematic view of the circuit including a charge pump having only one stage and outputting negative voltage in conventional arts.
Figure 2:
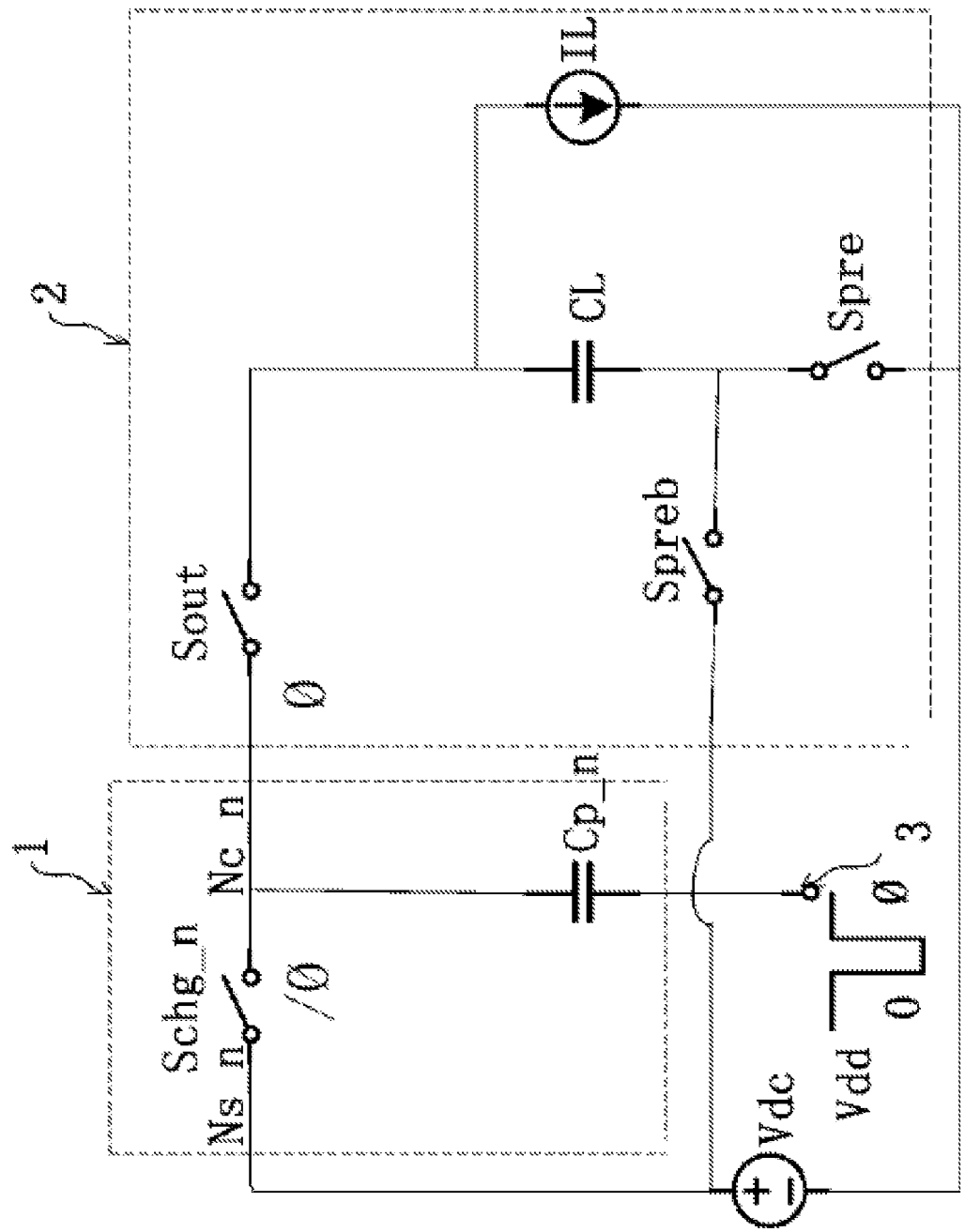
FIG. 2 is a diagram of the circuit including a fast startup charge pump circuit according to some embodiments.
Figure 3:
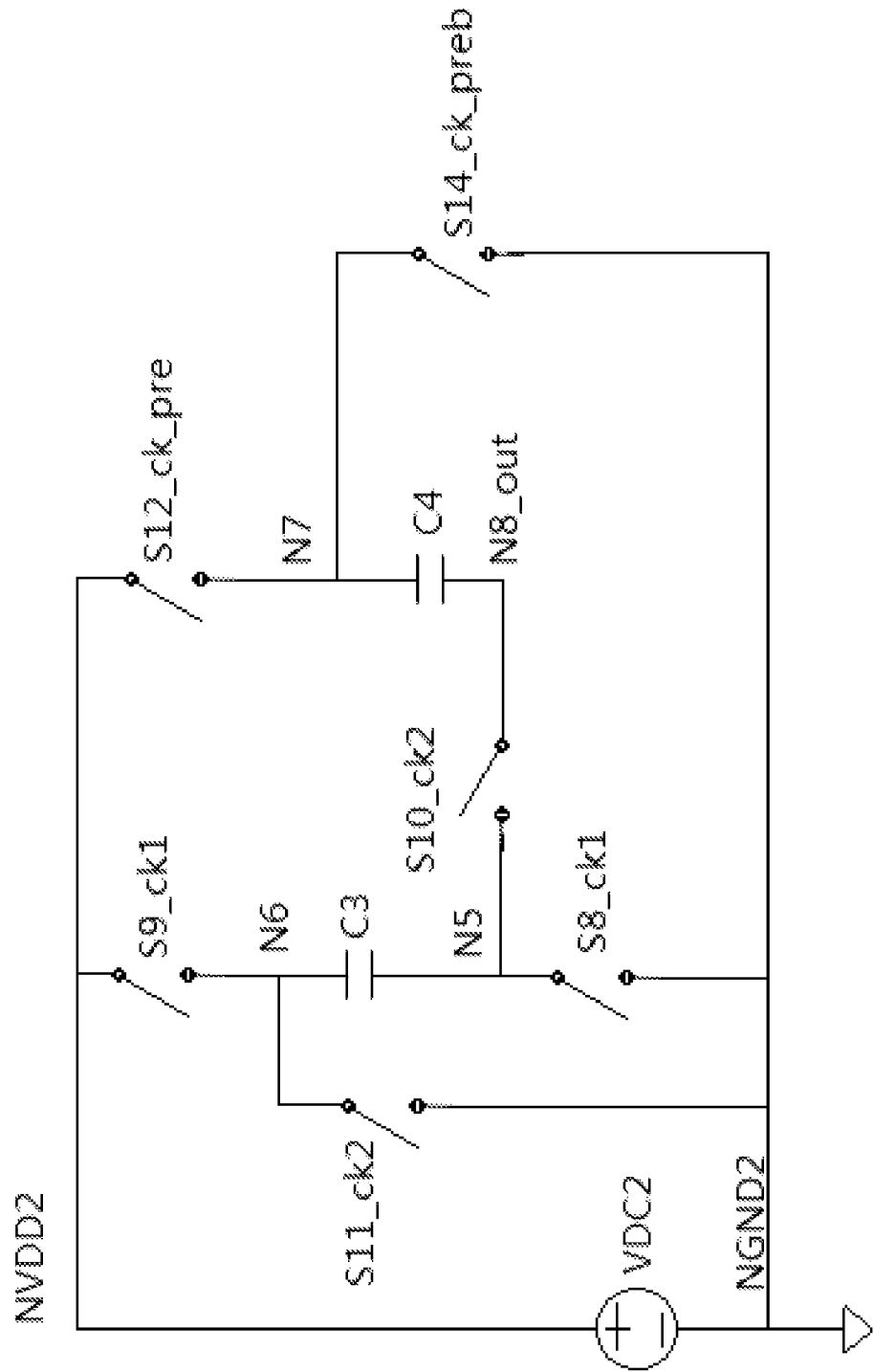
FIG. 3 is a diagram of an embodiment of the negative charge pump circuit which can fast startup according to some embodiments.

FIG. 3 is an embodiment of negative voltage fast startup charge pump according to some embodiments, pump capacitor C3, switch S8_ck1 and switch S10_ck2 are connected to node N5; Pump capacitor C3, switch S11_ck2 and switch S9_ck1 are connected to node N6; The positive electrode of the power supply VDC2, switch S9_ck1 and switch S12_ck_pre are connected to node NVDD2; Capacitor C4, switch S12_ck_pre and switch S14_ck_preb are connected to node N7; Capacitor C4 and switch S10_ck2 are connected to node N8_out, and node N8_out is an output node for external load; The negative electrode of the power supply VDC2, switch S11_ck2, switch S8_ck1 and switch S14_ck_preb are connected to node NGND2. After circuit pre-charging and during normal working period, switch S8_ck1 and switch S9_ck1 are controlled by the same clock ck1; Switch S11_ck2 and switch S10_ck2 are controlled by the clock ck2, where clock ck2 is an inverse of clock ck1; During the first clock pulse which is after circuit enable signal, the switch S8_ck1, switch S10_ck2, switch S12_ck_pre and (or) switch S9_ck1 are switched on all the time, and at the same time, the other switches are switched off, in order to pre-charging the output capacitor and (or) the pump capacitor, after pre-charging and during the normal working period, the switches are configured to ensure the normal operation of the charge pump: keep switching off the switch S12_ck_pre, keep switching on the switch S14_ck_preb, and other switches are operated according to the time course for conventional charge pumps. According to some embodiments, the inverted clock signal is not completely reversed, in fact, in order to prevent the leakage during a period of switching the switch, preferably, clock signal should be non-overlapping.

Figure 4:
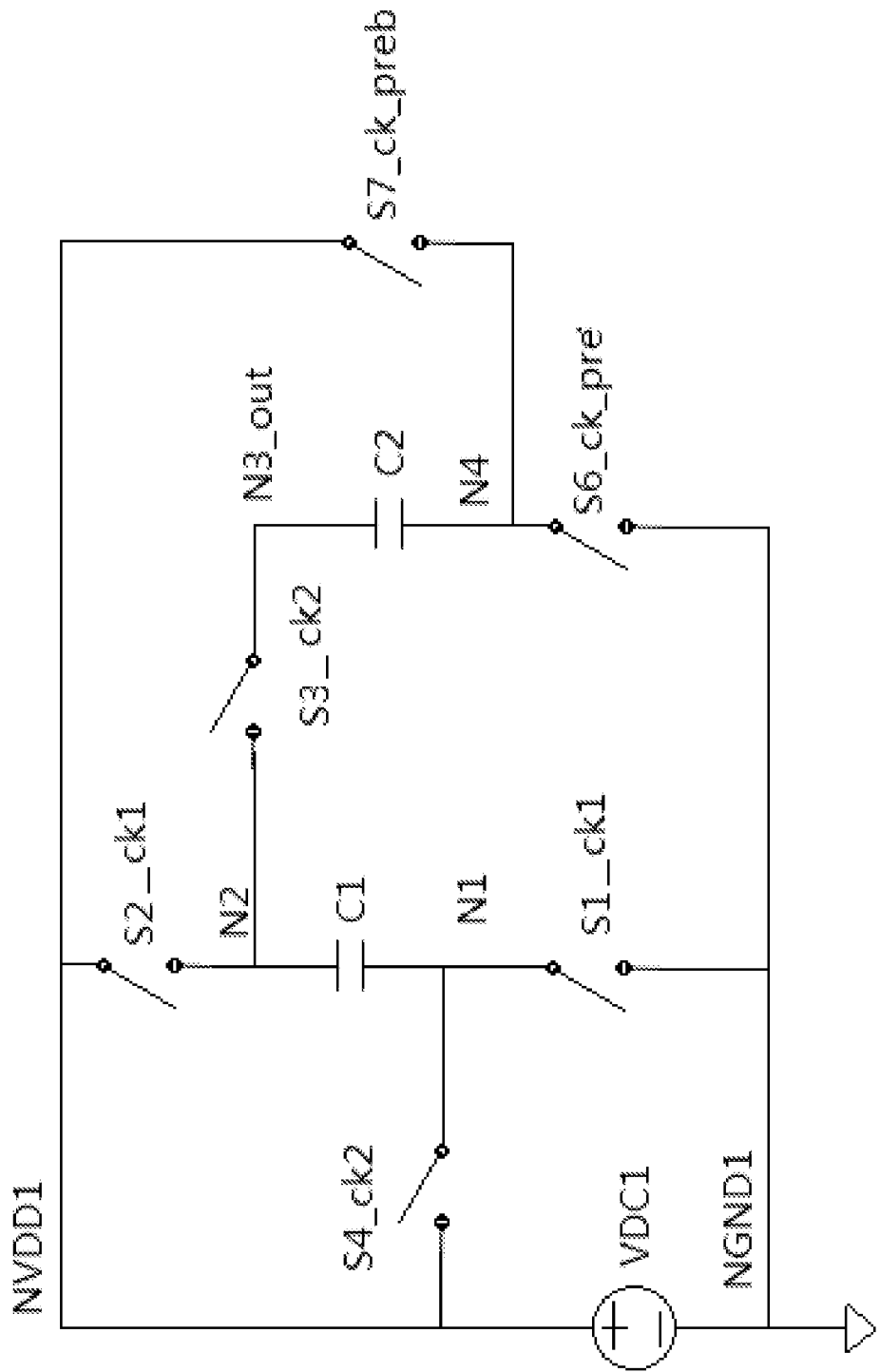
FIG. 4 is a diagram of an embodiment of the positive charge pump circuit which can fast startup according to some embodiments.
Figure 5:
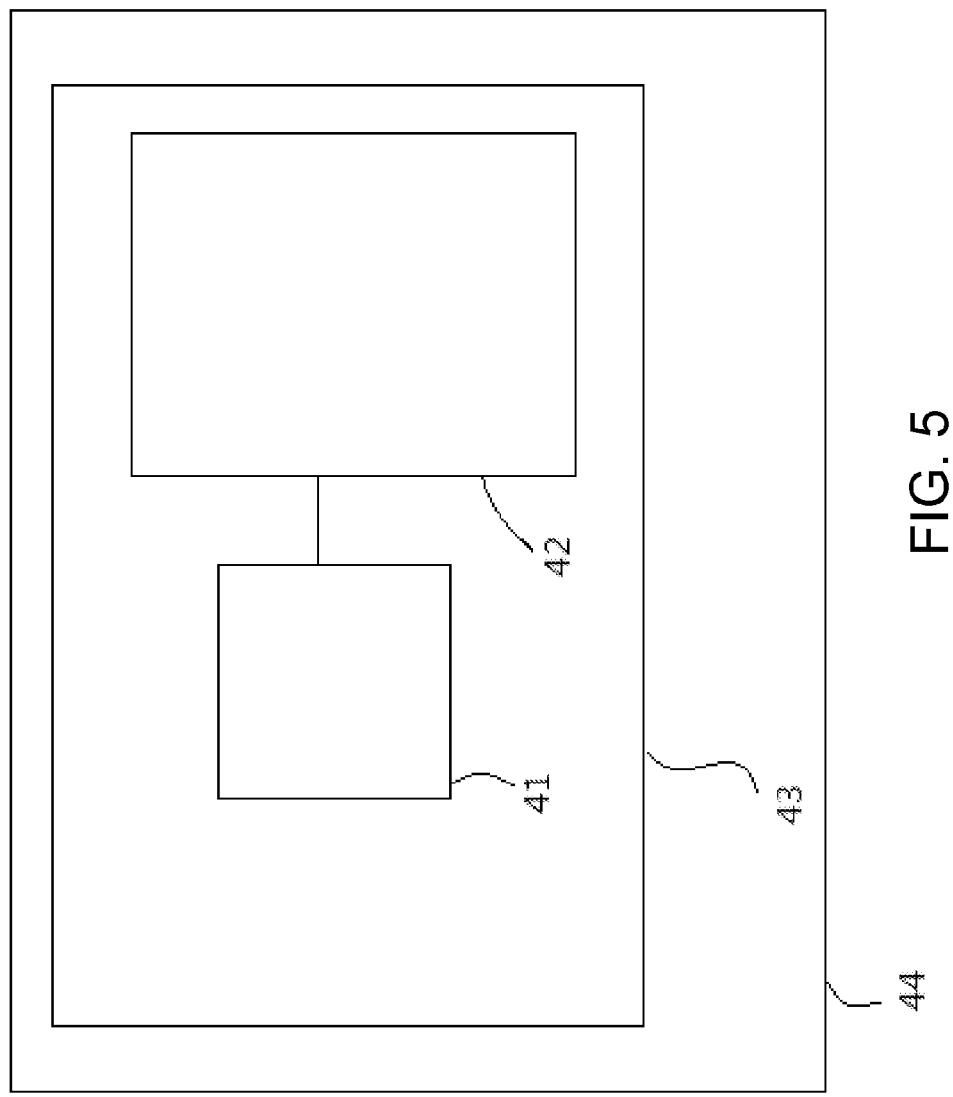
FIG. 5 is a diagram for the application of some embodiments in RF antenna switch controller.

FIG. 4 is an embodiment of positive voltage fast startup charge pump according to some embodiments, pump capacitor C1, switch S1_ck1 and switch S4_ck2 are connected to node N1; Pump capacitor C1, switch S3_ck2 and switch S2_ck1 are connected to node N2; The positive electrode of the power supply VDC1, switch S4_ck2, switch S2_ck1 and switch S7_ck_preb are connected to node NVDD1; Capacitor C2 and switch S3_ck2 are connected to node N3_out, and the N3_out is a output node for external load; Capacitor C2, switch S7_ck_preb and S6_ck_pre are connected to node N4; The negative electrode of power supply VDC1, switch S1_ck1 and switch S6_ck_pre are connected to node NGND1. When the circuit works, switch S2_ck1 and switch S1_ck1 are controlled by the same clock ck1; Switch S4_ck2 and switch S3_ck2 are controlled by the clock ck2, where clock ck2 is an inverse of clock ck1; During the first clock pulse which is after circuit enable signal, the switch S6_ck_pre, switch S3_ck2, switch S2_ck1 and (or) switch S1_ck1 are switched on all the time, and at the same time, the other switches are switched off, in order to pre-charging the output capacitor and (or) the pump capacitor, after pre-charging and during the normal working period, the switches are configured to ensure the normal operation of the charge pump: keep switching off the switch S6_ck_pre, keep switching on the switch S7_ck_preb, and the other switches are operated according to the time course for conventional charge pumps. According to some embodiments, the inverted clock signal is not completely reversed, in fact, in order to prevent the leakage during a period of switching the switch, preferably, the clock signal should be non-overlapping.

All references referred to in the present disclosure are incorporated by reference in their entirety. Although specific embodiments have been described above in detail, the description is merely for purposes of illustration. It should be appreciated, therefore, that many aspects described above are not intended as required or essential elements unless explicitly stated otherwise. Various modifications of, and equivalent acts corresponding to, the disclosed aspects of the exemplary embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

The invention claimed is:

1. A fast startup charge pump circuit, comprising:
   a charge pump; and
   an output stage;
   wherein the load of the charge pump, during the period of pre-charging time, that is, during the short period of time when the charge pump starts-up, switch (Spre) and switch (Spreb) are set as: once the charge pump is negative charge pump, the switch (Spre) is ON (having low-impedance), the switch (Spreb) is OFF (having high-impedance); once the charge pump is positive charge pump, the switch (Spre) is OFF (having high-impedance), the switch (Spreb) is ON (having low-impedance); once the pre-charging is over, the switch (Sper) and the switch (Spreb) are in the position that opposite to the state in the period of pre-charging time.

2. The circuit of claim 1, wherein the charge pump is a positive charge pump circuit or a negative charge pump circuit.

3. The circuit of claim 1, wherein the charge pump comprises repeating units connected to each other with a cascade configuration.

4. The circuit of claim 3, wherein the charge pump comprises a pump switch (Schg_n) and a pump capacitor (Cp_n), the pump switch (Schg_n) connects to the pump capacitor (Cp_n) in series through a node (Nc_n); wherein if a plurality of charge pumps are connected to each other, a terminal (Ns_n) of a pump switch (Schg_n) of a current charge pump stage is configured to be connected to a node (Nc_n−1) of a previous charge pump stage while the terminal (Ns_n) is not connected to the capacitor (Cp_n); a terminal (Nc_n) of a pump switch (Schg_n) of the current charge pump stage is configured to be connected to a node (Ns_n−1) of a next charge pump stage while the terminal (Nc_n) is connected to the capacitor (Cp_n).

5. The circuit of claim 1, wherein if the charge pump is a positive charge pump, a terminal (Ns_n) of a first stage charge pump (n=1) connects to a high-voltage side of a voltage source; if the charge pump is a negative charge pump, the terminal (Ns_n) of the first stage charge pump connects to a low-voltage side of the voltage source.

6. The circuit of claim 1, wherein after the pre-charging, a connecting terminal of the pump capacitor of the charge pump is controlled by a control line while this connecting terminal is not connected to a pump switch of the current charge pump stage, the control signal inputted to the control line is defined as symbol "ø"; and when the charge pumps are configured to be connected to each other in a multi-stage charge pump configuration, in the two adjacent charge pump stages, supplying one charge pump stage with a control signal that has an opposite-phase relation to a control signal of another charge pump stage.

7. The circuit of claim 6, wherein after the pre-charging, a connecting terminal of the pump capacitor of the charge pump is controlled by a control line while this connecting terminal is not connected to a pump switch of the current charge pump stage, the control signal inputted to the control line is defined as symbol "ø"; and when the charge pumps are configured to be connected to each other in a multi-stage charge pump configuration, in the two adjacent charge pump stages, supplying one charge pump stage with a control signal that has a non-overlapping relation to a control signal of another charge pump stage.

8. The circuit of claim 7, wherein if the switches (Schg_n) and the outputs (Sout) of all stages of the charge pumps are in a period of pre-charging time, they can be set in ON position instead of the "opposite-phase" or "non-overlapping".

9. The circuit of claim 8, wherein at a positive charge pump, the switch (Spreb) is always OFF, or not exists in the circuit, correspondingly, the switch (Spre) is always ON, or replace the switch (Spre) with a conductive wire.

10. The circuit of claim 9, wherein an electronic device having the said circuit is manufactured by CMOS technology or SOI technology or BiCMOS technology.

11. An electronic device, comprising a fast startup charge pump circuit including:
a charge pump; and
an output stage;
wherein a load of the charge pump is the output stage for buffering an output voltage and for reducing a voltage ripple of a current supply (IL); comprising an output switch (Sout), a switch (Spre) for pre-charging, a switch (Spreb), load capacitor (CL) and a current supply (IL) of the analog output load; wherein the output switch (Sout), load capacitor (CL) and switch (Spre) are connected in series; the non-capacitance (CL) connection of Spre connects to the low-voltage end of the DC voltage source; one terminal of the switch (Spre) is configured to be connected to a low voltage side of a DC voltage source while this terminal of the switch (Spre) is not connected to the load capacitor (CL), one terminal of the output switch (Sout) is configured to be connected to a node (Nc_n) of the last charge pump stage while this terminal of the output switch (Sout) is not connected to the load capacitor (CL), one terminal of the switch (Spreb) is connected to a common node between the switch (Spre) and the load capacitor (CL), while another terminal of the switch (Spreb) is connected to a high voltage side of the DC voltage source, one terminal of the current source IL of the analog output load is connected to a common node between the output switch (Sout) and the load capacitor (CL), while another terminal of the current source IL is connected to the low voltage side of the DC voltage source.

12. The electronic device of claim 11, wherein the electronic device is configured as an RF power amplifier.

13. The electronic device of claim 12, wherein the electronic device further comprises an RF antenna switch controller.

14. The electronic device of claim 13, wherein the fast startup charge pump circuit and the RF antenna switch controller are formed over a common semiconductor substrate.

15. An electronic system comprising a plurality of fast startup charge pump circuits, each circuit comprising:
a charge pump; and
an output stage;
wherein a load of the charge pump is the output stage for buffering an output voltage and for reducing a voltage ripple of a current supply (IL); comprising an output switch (Sout), a switch (Spre) for pre-charging, a switch (Spreb), load capacitor (CL) and a current supply (IL) of the analog output load; wherein the output switch (Sout), load capacitor (CL) and switch (Spre) are connected in series; the non-capacitance (CL) connection of Spre connects to the low-voltage end of the DC voltage source; one terminal of the switch (Spre) is configured to be connected to a low voltage side of a DC voltage source while this terminal of the switch (Spre) is not connected to the load capacitor (CL), one terminal of the output switch (Sout) is configured to be connected to a node (Nc_n) of the last charge pump stage while this terminal of the output switch (Sout) is not connected to the load capacitor (CL), one terminal of the switch (Spreb) is connected to a common node between the switch (Spre) and the load capacitor (CL), while another terminal of the switch (Spreb) is connected to a high voltage side of the DC voltage source, one terminal of the current source IL of the analog output load is connected to a common node between the output switch (Sout) and the load capacitor (CL), while another terminal of the current source IL is connected to the low voltage side of the DC voltage source.

16. The system of claim 15, wherein the plurality of fast startup charge pump circuits are connected in a cascade configuration.

17. The system of claim 15, wherein at least one of the plurality of charge pumps comprises a pump switch (Schg_n) and a pump capacitor (Cp_n), the pump switch (Schg_n) connects to the pump capacitor (Cp_n) in series through a node (Nc_n); wherein if a plurality of charge pumps are connected to each other, a terminal (Ns_n) of a pump switch (Schg_n) of a current charge pump stage is configured to be connected to a node (Nc_n−1) of a previous charge pump stage while the terminal (Ns_n) is not connected to the capacitor (Cp_n); a terminal (Nc_n) of a pump switch (Schg_n) of the current charge pump stage is configured to be connected to a node (Ns_n−1) of a next charge pump stage while the terminal (Nc_n) is connected to the capacitor (Cp_n).

* * * * *